United States Patent
Pinarbasi

(10) Patent No.: US 7,397,640 B2
(45) Date of Patent: Jul. 8, 2008

(54) METHODS AND APPARATUS FOR IMPROVED READ SENSORS USING A MULTI-LAYERED SEED LAYER STRUCTURE HAVING A NITROGENATED NICKEL-TANTALUM LAYER

(75) Inventor: Mustafa Michael Pinarbasi, Morgan Hill, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 395 days.

(21) Appl. No.: 11/231,045

(22) Filed: Sep. 20, 2005

(65) Prior Publication Data
US 2006/0012925 A1    Jan. 19, 2006

Related U.S. Application Data

(63) Continuation-in-part of application No. 10/881,062, filed on Jun. 30, 2004.

(51) Int. Cl.
*G11B 5/127* (2006.01)

(52) U.S. Cl. ............................ 360/324.12

(58) Field of Classification Search ............ None
See application file for complete search history.

(56) References Cited

U.S. PATENT DOCUMENTS

| 7,177,121 | B2 * | 2/2007 | Kojima et al. | 360/324.12 |
| 7,259,941 | B2 * | 8/2007 | Pinarbasi | 360/324.12 |
| 2006/0002041 | A1 * | 1/2006 | Pinarbasi | 360/324.12 |
| 2007/0091515 | A1 * | 4/2007 | Freitag et al. | 360/324.12 |
| 2007/0253123 | A1 * | 11/2007 | Freitag et al. | 360/324.12 |

* cited by examiner

*Primary Examiner*—Angel A Castro
(74) *Attorney, Agent, or Firm*—John J. Oskorep, Esq.; Rambod Nader

(57) ABSTRACT

A magnetic head with improved hard magnet properties includes a sensor stack structure and a multi-layered seed layer structure formed over crystalline materials of the sensor stack structure. The multi-layered structure has a first layer including chromium-molybdenum (CrMo); a second layer including nitrogenated nickel-tantalum (NiTa+N); and a third layer including chromium-molybdenum (CrMo). A hard bias layer formed over the multi-layered structure is preferably cobalt-platinum-chromium (CoPtCr). Methods of making the magnetic head are also described.

26 Claims, 7 Drawing Sheets

US 7,397,640 B2

METHODS AND APPARATUS FOR IMPROVED READ SENSORS USING A MULTI-LAYERED SEED LAYER STRUCTURE HAVING A NITROGENATED NICKEL-TANTALUM LAYER

CROSS-REFERENCE TO RELATED APPLICATION

This application is a continuation-in-part of U.S. patent application Ser. No. 10/881,062 filed on Jun. 30, 2004 entitled "Methods And Apparatus For Improved Hard Magnet Properties In Magnetoresistive Read Heads Using A Multi-Layered Seed Layer Structure", which is hereby incorporated by reference herein.

BACKGROUND

1. Field of the Technology

This invention relates generally to magnetic read heads having read sensors for reading information signals from a magnetic medium, and more particularly to an improved seed layer structure for hard bias layers formed adjacent the read sensor where the seed layer structure is formed over crystalline materials of the read sensor.

2. Description of the Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read (MR) sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer. A common type of MR sensor is the giant magnetoresistance (GMR) sensor which manifests the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., nickel-iron (NiFe), cobalt (Co), or nickel-iron-cobalt (NiFeCo)) separated by a layer of nonmagnetic material (e.g., copper (Cu)) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (e.g., nickel-oxide (NiO), iridium-manganese (IrMn) or platinum-manganese (PtMn)) layer.

The magnetization of the other ferromagnetic layer, referred to as the free layer, however, is not fixed and is free to rotate in response to the field from the information recorded on the magnetic medium (the signal field). In the SV sensors, SV resistance varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. In addition to the magnetoresistive material, the GMR sensor has conductive lead structures for connecting the GMR sensor to a sensing means and a sense current source. Typically, a constant current is sent through the GMR sensor through these leads and the voltage variations caused by the changing resistance are measured via these leads.

To illustrate, FIG. 1 shows a prior art SV sensor 100 having end regions 104 and 106 which are separated by a central region 102. A free layer 110 is separated from a pinned layer 120 by a non-magnetic, electrically-conducting spacer 115. The magnetization of pinned layer 120 is fixed by an AFM pinning layer 121, which is formed on a gap layer 123 residing on a substrate 180. Cap layer 108, free layer 110, spacer layer 115, pinned layer 120, and AFM pinning layer 121 are all formed in central region 102. Gap layer 123 is typically an insulator layer made of an amorphous material such as alumina ($Al_2O_3$).

Conventionally, hard bias layers 130 and 135 are formed in end regions 104 and 106 in order to stabilize free layer 110. These hard bias layers 130 and 135 are typically formed of a cobalt-based alloy which is sufficiently magnetized and perhaps shielded so that the magnetic fields of the media and/or the write head do not effect the magnetism of the hard magnets. Seed layers 150 and 155 are also deposited in end regions 104 and 106 underneath hard bias layers 130 and 135 to set a texture for the successful deposition of the hard magnets by promoting a desired c-axis in plane orientation. To perform effectively, hard bias layers 130 and 135 should have a high coercivity, a high MrT (magnetic remanence× thickness), and a high in-plane squareness on the magnetization curve. A preferred cobalt-based alloy for hard bias layers 130 and 135 is cobalt-platinum-chromium (CoPtCr), while seed layers 150 and 155 typically comprise chromium (Cr) or other suitable metallic element.

Thus, as illustrated in FIG. 1, seed layers 150 and 155 and hard bias layers 130 and 135 are formed in end regions 104 and 106, respectively, and provide longitudinal bias for free layer 110. Leads 140 and 145 are formed over hard bias layers 130 and 135, respectively. Seed layers 150 and 155 are formed over the amorphous materials (e.g. alumina) of gap layer 123. Seed layers 150 and 155, hard bias layers 130 and 135 and lead layers 140 and 145 also abut first and second side edges of the read sensor in a connection which is referred to in the art as a "contiguous junction". Crystalline materials such as tantalum (Ta), nickel-iron (NiFe), cobalt-iron (CoFe), copper (Cu), platinum-manganese (PtMn) and ruthenium (Ru) are exposed at first and second side edges of the contiguous junctions.

Leads 140 and 145 provide electrical connections for the flow of the sensing current $I_s$ from a current source 160 to the MR sensor 100. Sensing means 170 connected to leads 140 and 145 sense the change in the resistance due to changes induced in the free layer 110 by the external magnetic field (e.g. field generated by a data bit stored on a disk). One material for constructing the leads in the SV sensor is a highly conductive material, such as a metal.

FIG. 2 shows a prior art SV sensor 200, similar to prior art SV sensor 100 (FIG. 1), comprising end regions 204 and 206 separated by a central region 202. A free layer 210 is separated from a pinned layer 220 by a non-magnetic, electrically-conducting spacer 215. The magnetization of pinned layer 220 is fixed by an AFM pinning layer 221, which is formed on a gap layer 223 residing on a substrate 280. Cap layer 208, free layer 210, spacer layer 215 and pinned layer 220 are all formed in central region 202.

Unlike prior art SV sensor 100 of FIG. 1, prior art SV sensor 200 of FIG. 2 is a partial mill design with materials of AFM pinning layer 221 of sensor 200 extending into end regions 204 and 206. By "partial mill design", it is meant that the read sensor layers are not fully etched or milled in end regions 204 and 206 prior to the deposition of the seed, hard bias, and lead materials. A partial mill design is desirable in order to reduce the spacing of the "read gap" (i.e. the distance from shield to shield which encapsulates the read sensor) so that the sensor's bit per inch (BPI) capability can be increased, as it reduces the possibility of electrical shorts to the shield.

As illustrated in FIG. 2, seed layers 250 and 255 and hard bias layers 230 and 235 are formed in end regions 204 and 206, respectively. Hard bias layers 230 and 235 provide longitudinal biasing for free layer 210. Leads 240 and 245 are formed over hard bias layers 230 and 235, respectively. In the partial mill design, seed layers 250 and 255 are formed directly on crystalline materials of sensor 202 which extend into end regions 204 and 206. In the example of FIG. 2, seed layers 250 are formed directly on top of materials of AFM layer 221 which extend into end regions 204 and 206. Seed layers 250 and 255, hard bias layers 230 and 235 and lead layers 240 and 245 also abut first and second side edges in end regions 204 and 206 adjacent SV sensor 200 in a contiguous junction. The crystalline materials of sensor 202 include materials such as tantalum (Ta), nickel-iron (NiFe), cobalt-iron (CoFe), copper (Cu), ruthenium (Ru), platinum-manganese (PtMn), as examples. As similarly described early in FIG. 1, leads 240 and 245 provide electrical connections for the flow of the sensing current $I_s$ from a current source 260 to the MR sensor 200. Sensing means 270 connected to leads 240 and 245 sense the change in the resistance due to changes induced in the free layer 210 by the external magnetic field.

The preferred seed layer material of chromium (Cr) and the preferred hard magnet material of cobalt-platinum-chromium (CoPtCr) formed over amorphous materials such as the gap layer of alumina ($Al_2O_3$) (see FIG. 1) or glass exhibits favorable properties for sensor biasing purposes, such as increased coercivity and squareness of the hard magnets. However, these properties degrade when deposited on crystalline materials of read sensor layers such as tantalum (Ta), nickel-iron (NiFe), cobalt-iron (CoFe), copper (Cu), ruthenium (Ru), platinum-mangangese (PtMn), etc., as in the partial mill design shown in FIG. 2.

Accordingly, what are needed are methods and apparatus for improving hard magnet properties in SV sensors when the hard magnet seed layer structure is formed over crystalline materials.

SUMMARY

As described herein, it has been discovered that improved hard magnetic properties are exhibited by a hard bias layer when utilizing a multi-layered seed layer structure having a layer comprising nitrogenated nickel-tantalum (NiTa+N) and a layer comprising chromium (e.g. chromium-molybdenum (CrMo)) formed upon crystalline materials of a sensor stack structure. In particular, the hard bias layer exhibits increased coercivity and squareness of the hard magnets as compared to prior art layer structures formed over crystalline materials.

Specifically, a magnetic head having improved hard magnet properties includes a spin valve (SV) sensor stack structure; and a multi-layered seed layer structure formed over crystalline materials of the sensor stack structure. A hard bias layer is further formed over the multi-layered structure. The multi-layered structure includes a bottom layer comprising nitrogenated nickel-tantalum (NiTa+N) and a top layer comprising chromium-molybdenum (CrMo). Alternatively, the multi-layered structure includes a bottom layer comprising CrMo, a middle layer comprising nitrogenated nickel-tantalum (NiTa+N), and a top layer comprising CrMo. Other variations are possible. The hard bias layer may be made from a cobalt-based alloy, such as cobalt-platinum-chromium (CoPtCr). The crystalline materials may include materials such as tantalum (Ta), nickel-iron (NiFe), cobalt-iron (CoFe), copper (Cu), ruthenium (Ru), and platinum-manganese (PtMn), as examples. A lead layer may be formed over the hard bias layer.

A hard disk drive may embody the magnetic head. This hard disk drive has at least one rotatable magnetic disk; a spindle supporting the at least one rotatable magnetic disk; a disk drive motor for rotating the at least one rotatable magnetic disk; a magnetic head for reading data from the at least one rotatable magnetic disk; and a slider for supporting the magnetic head. The magnetic head having improved hard magnet properties includes an SV sensor; a multi-layered seed layer structure formed upon crystalline materials of sensor layers in end regions adjacent the sensor; and a hard bias layer formed over the multi-layered seed layer structure. The multi-layered seed layer structure includes a spin valve (SV) sensor stack structure; and a multi-layered structure formed adjacent crystalline materials of the sensor stack structure. A hard bias layer is further formed over the multi-layered structure. The multi-layered structure includes a bottom layer comprising nitrogenated nickel-tantalum (NiTa+N) and a top layer comprising chromium-molybdenum (CrMo). Alternatively, the multi-layered structure includes a bottom layer comprising CrMo, a middle layer comprising nitrogenated nickel-tantalum (NiTa+N), and a top layer comprising CrMo. Other variations are possible. The crystalline materials of the sensor may include materials such as tantalum (Ta), nickel-iron (NiFe), cobalt-iron (CoFe), copper (Cu), ruthenium (Ru), and platinum-manganese (PtMn), as examples. A lead layer may be formed over the hard bias layer.

Finally, a method for use in forming a magnetic head includes forming a sensor stack structure. A multi-layered seed layer structure is then formed over crystalline materials of the sensor stack structure. A hard bias layer is further formed over the multi-layered structure. The multi-layered structure includes a bottom layer comprising nitrogenated nickel-tantalum (NiTa+N) and a top layer comprising chromium-molybdenum (CrMo). Alternatively, the multi-layered structure includes a bottom layer comprising CrMo, a middle layer comprising nitrogenated nickel-tantalum (NiTa+N), and a top layer comprising CrMo. The hard bias layer may be made from a cobalt-based alloy, such as cobalt-platinum-chromium (CoPtCr). The crystalline materials may include materials such as tantalum (Ta), nickel-iron (NiFe), cobalt-iron (CoFe), copper (Cu), ruthenium (Ru), and platinum-manganese, as examples. A lead layer may be formed over the hard bias layer.

BRIEF DESCRIPTION OF THE DRAWINGS

For a fuller understanding of the nature and advantages of the present application, as well as the preferred mode of use, reference should be made to the following detailed description read in conjunction with the accompanying drawings.

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 1:
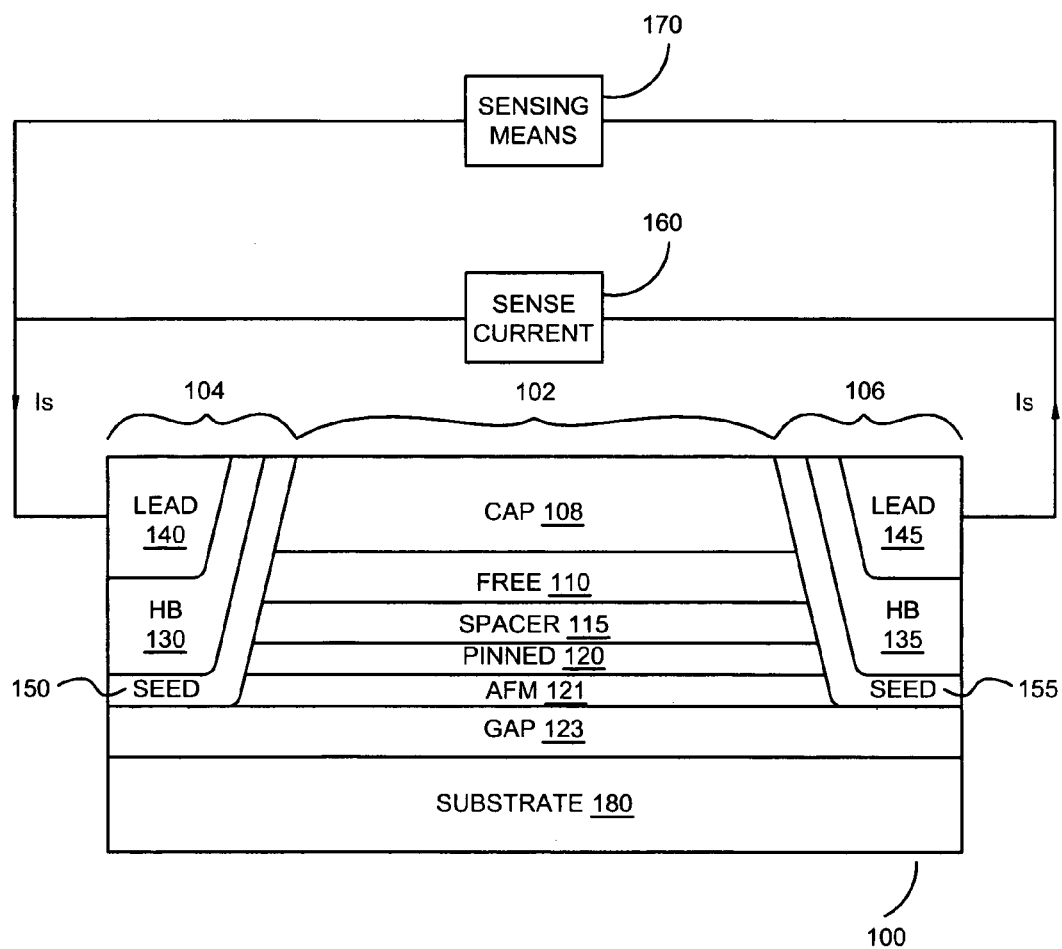
FIG. 1 is a schematic diagram of an air-bearing surface (ABS) view of the thin film structure of a prior art (spin valve) SV sensor device.
Figure 2:
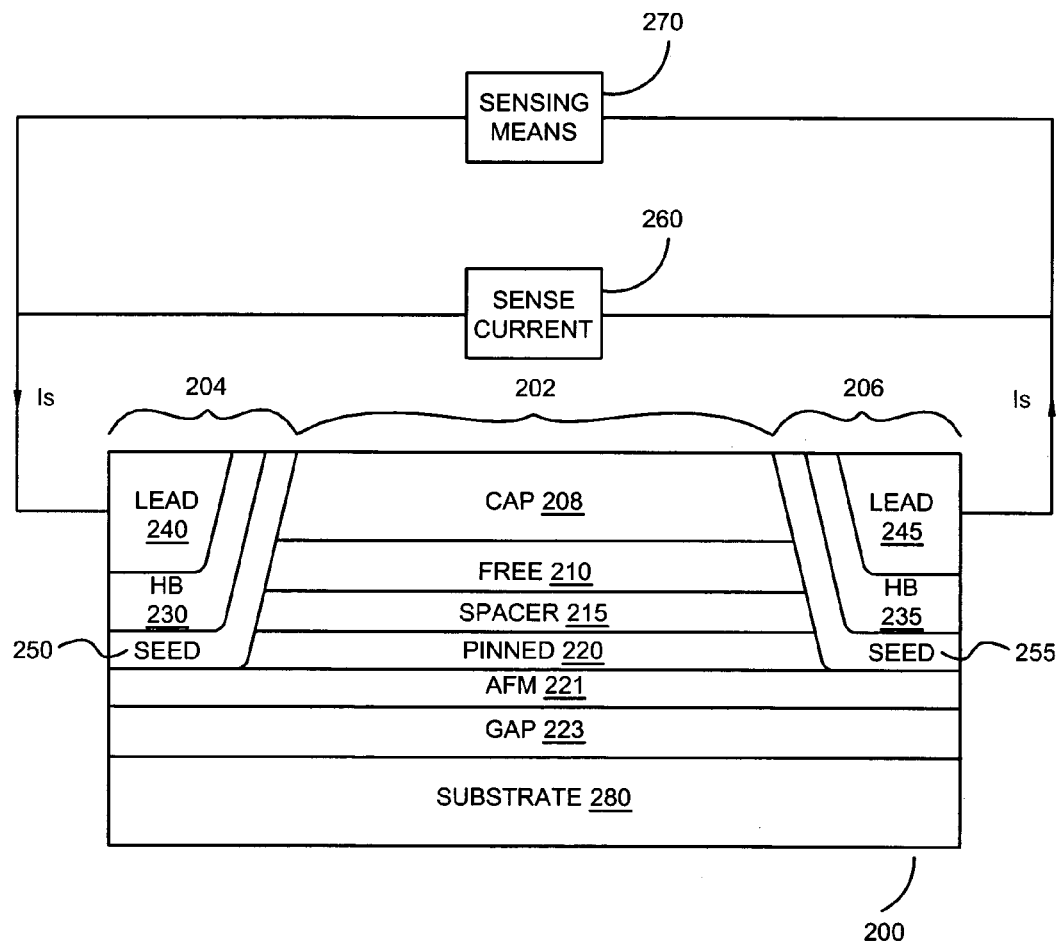
FIG. 2 is a schematic diagram of an air-bearing surface (ABS) view of the thin film structure of a partial mill prior art SV sensor device.
Figure 3:
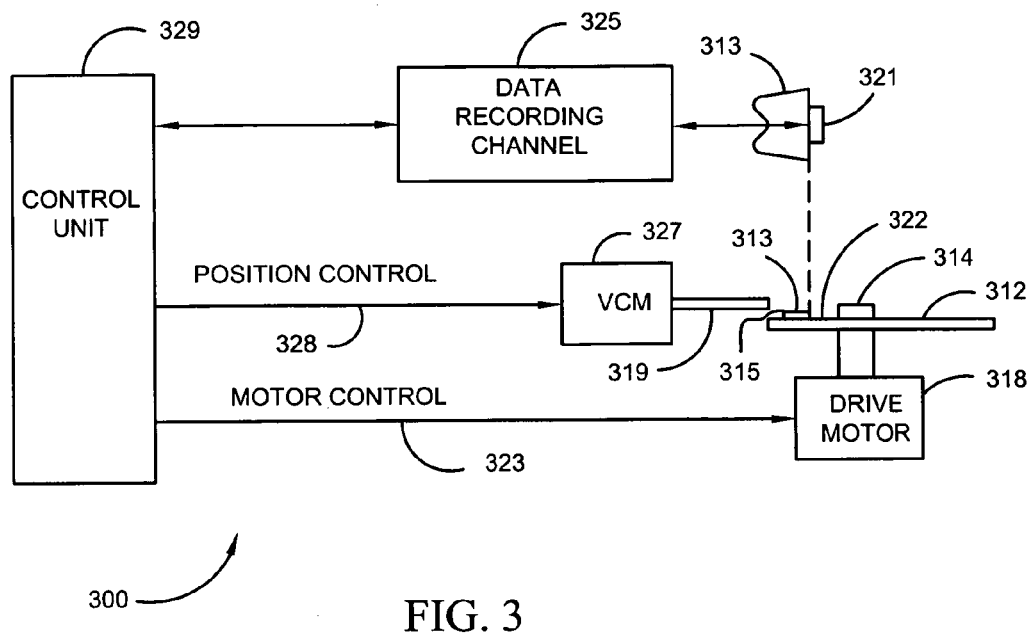
FIG. 3 is a block diagram of a magnetic recording disk drive system.

Referring to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting a magnetic read/write head 321 which incorporates the SV sensor of the present invention. As the disks rotate, slider 313 is moved radially in and out over disk surface 322 so that head 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write head 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
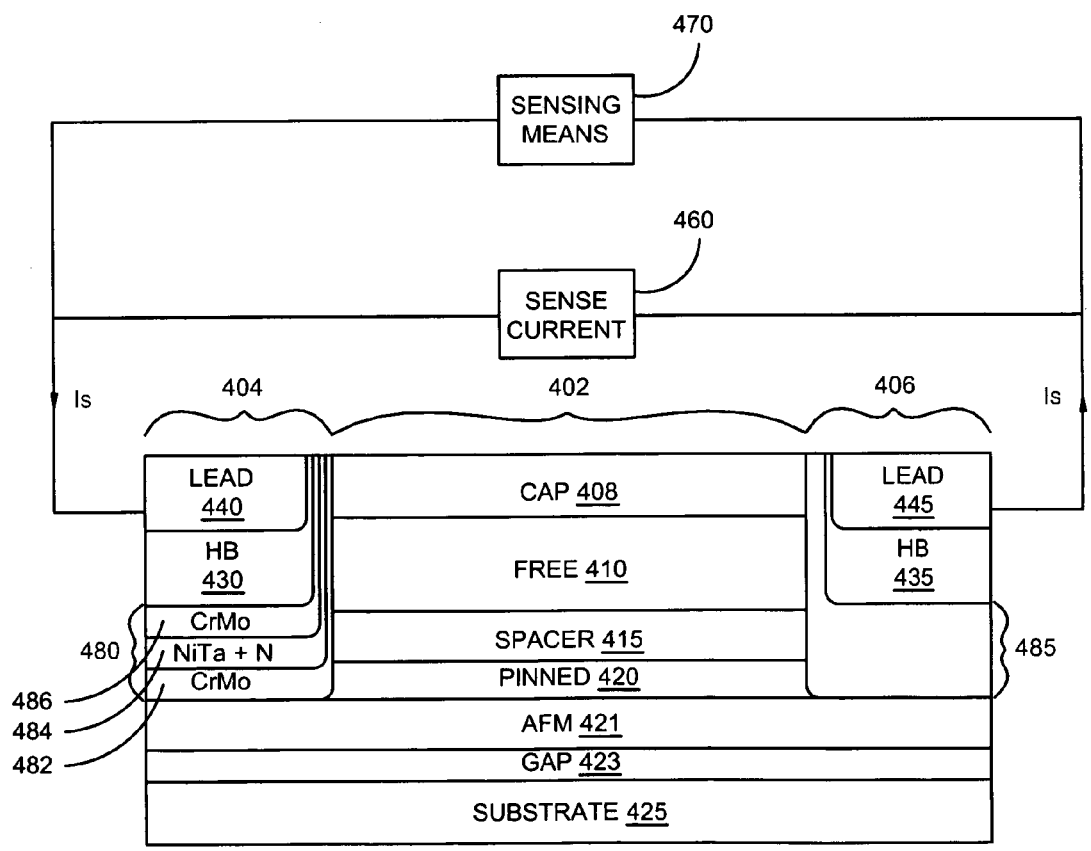
FIG. 4 is a schematic diagram of an ABS view of a thin film structure of a preferred embodiment SV sensor according to the present application.

FIG. 4 shows an air bearing surface (ABS) view of the SV sensor 400 according to the preferred embodiment of the present application. SV sensor 400 comprises end regions 404 and 406 separated by a central region 402. A sensing layer (free ferromagnetic layer) 410 is separated from a pinned layer (pinned ferromagnetic layer) 420 by a non-magnetic, electrically-conducting spacer layer 415. The magnetization of the pinned layer 420 is fixed by an antiferromagnetic (AFM) layer 421. Cap layer 408, sensing layer 410, spacer layer 415 and pinned layer 420 are all formed in central region 402 and form components of a sensor stack structure.

SV sensor 400 is a "partial mill" design since AFM pinning layer 221 extends into end regions 204 and 206. That is, read sensor materials in end regions 204 and 206 are not fully (but only partially) removed from an ion milling process. AFM pinning layer 221 also forms a component of the sensor stack structure. A partial mill design is desirable in order to reduce the spacing of the "read gap" (i.e. the distance from shield to shield which encapsulates the read sensor) so that the sensor's bit per inch (BPI) capability can be increased), as it reduces the possibility of electrical shorts to the shield.

Hard bias layers 430 and 435 formed in the end regions 404 and 406, respectively, and more or less in contact with the spin valve sensor layers in the central region 402, provide longitudinal bias for free layer 410. Leads 440 and 445 formed over hard bias layers 430 and 435, respectively, provide electrical connections for the flow of the sensing current $I_s$ from a current source 460 to the SV sensor 400. Sensing means 470 connected to leads 440 and 445 sense the change in the resistance due to changes induced in the free layer 410 by the external magnetic field (e.g. field generated by a data bit stored on a disk).

In this embodiment, sensing layer 410 is formed of nickel-iron (NiFe) and cobalt-iron (CoFe), pinned layer 420 is formed of cobalt-iron (CoFe), and spacer layer 415 is formed of copper (Cu). Preferably, pinned layer 420 comprises a multi-layer film structure such as a first ferromagnetic layer/spacer/second ferromagnetic layer (e.g., cobalt-iron (CoFe)/ruthenium (Ru)/cobalt-iron (CoFe)) where the first and second ferromagnetic layers are antiferromagnetically coupled by a spacer layer. AFM layer may be formed of platinum-manganese (PtMn), iridium-manganese (IrMn), and nickel-oxide (NiO).

Multi-layered seed layer structures 480 and 485, which in this embodiment are "tri-layered" seed layer structures, are formed in end regions 404 and 406, respectively. More particularly, multi-layered structures 480 and 485 are formed below hard bias layers 430 and 435, respectively, and adjacent the sensor stack structure in central region 402. Note also that multi-layered structures 480 and 485 are formed adjacent crystalline materials of the sensor stack structure in end regions 404 and 406. In this embodiment, multi-layered structures 480 and 485 are formed directly on the extended pinning layer of AFM materials. However, multi-layered structures 480 and 485 may be formed adjacent other layers of the sensor stack structure which extend into end regions 404 and 406, such as a seed layer (not shown in FIG. 4) of the sensor stack structure. Furthermore, multi-layered structure 480 and 485 may be formed adjacent other layers of the sensor stack structure which are located in central region 402, such as pinned layer structure 420 of the sensor stack structure, for example. Typically, the crystalline materials of the sensor stack structure include both magnetic materials and electrically conductive materials.

In this embodiment, multi-layered structure 480 has a first layer 482 corresponding to a bottom layer of multi-layered structure 480, a third layer 486 corresponding to a top layer of multi-layered structure 480 and a second layer 484 corresponding to a middle layer of multi-layered structure 480 formed between the first and the third layers 482 and 486, respectively. According to the present embodiment, first layer 482 is made of chromium-molybdenum (CrMo), second layer 484 is made of nitrogenated nickel-tantalum (NiTa+N), and third layer 486 is made of CrMo. Although not shown in FIG. 4, multi-layered structure 485 has the same first, second, and third layers as multi-layered structure 480. Preferably, each first layer 482 has a thickness of between 3-50 Angstroms, each second layer 484 has a thickness of between 3-100 Angstroms, and each third layer 486 has a thickness of between 20-200 Angstroms. Advantageously, the hard bias materials exhibit an increased coercivity and squareness. For example, hard bias layer 430 may have a coercivity of 1400 Oersteds (Oe) or higher.

In the cross-referenced application having a U.S. patent application Ser. No. 10/881,062 filed on 30 Jun. 2004 entitled "Methods And Apparatus For Improved Hard Magnet Properties In Magnetoresistive Read Heads Using A Multi-Layered Seed Layer Structure", a multi-layered seed layer structure is disclosed. In the '062 application, a NiTa layer is subsequently exposed to oxygen to set the desired properties of the hard bias layer. While this approach is advantageous, a parasitic resistance may result within the surface-oxidized NiTa layer.

The techniques of the present application include depositing a NiTa layer of the multi-layered structure in a nitrogen atmosphere and subsequently exposing the layer comprising nitrogenated nickel tantalum (NiTa+N) to oxygen. Through deposition of the NiTa in the nitrogen, the hard bias materials exhibit an increased coercivity and squareness without the disadvantage of unacceptable levels of parasitic resistance.

Thus, the magnetic head has a read sensor formed in central region 402, multi-layered structures 480 and 485 formed in end regions 404 and 406 adjacent the read sensor and upon crystalline materials of the read sensor layers; and hard bias layers 430 and 435 formed over multi-layered seed layer structures 480 and 485. Each one of multi-layered seed layer structures 480 and 485 includes first seed layer 482 made of CrMo, second seed layer 484 made of nitrogenated nickel-tantalum, and third seed layer 486 made of CrMo.

Figure 5:
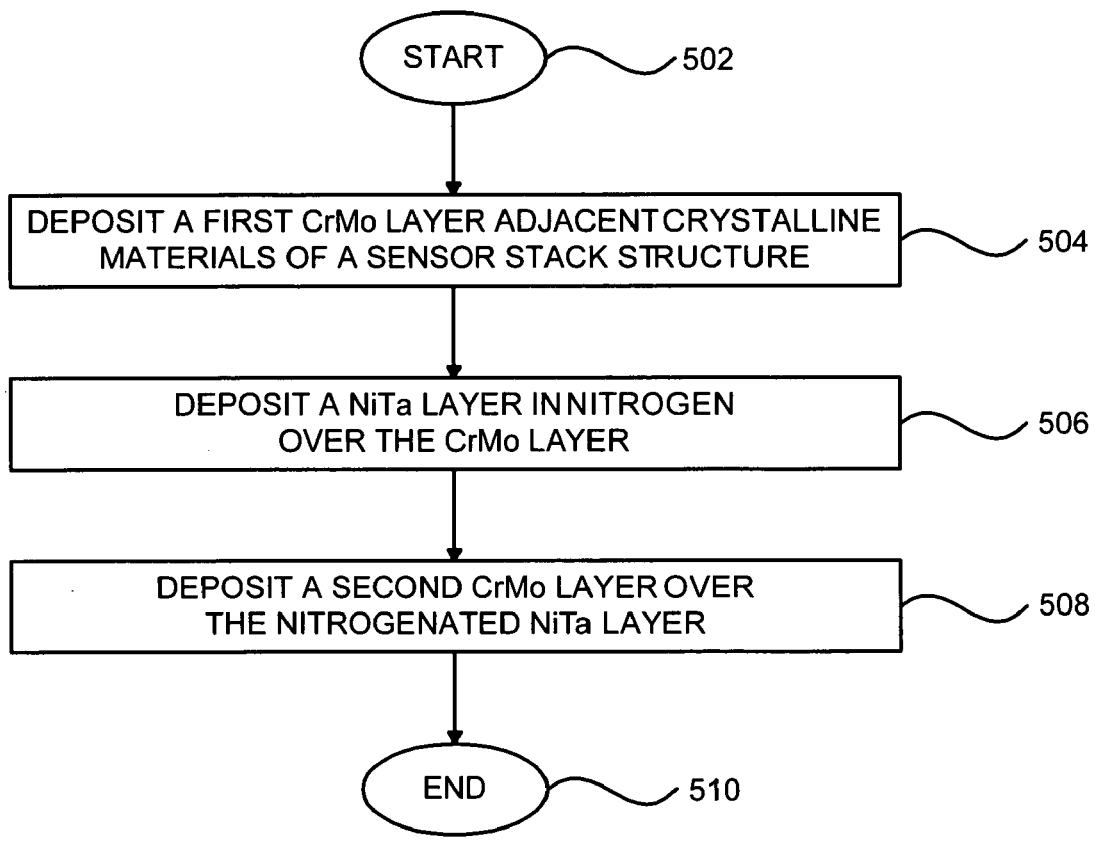
FIG. 5 is a flowchart describing a method of making an SV sensor according to the present application.
Figure 6:
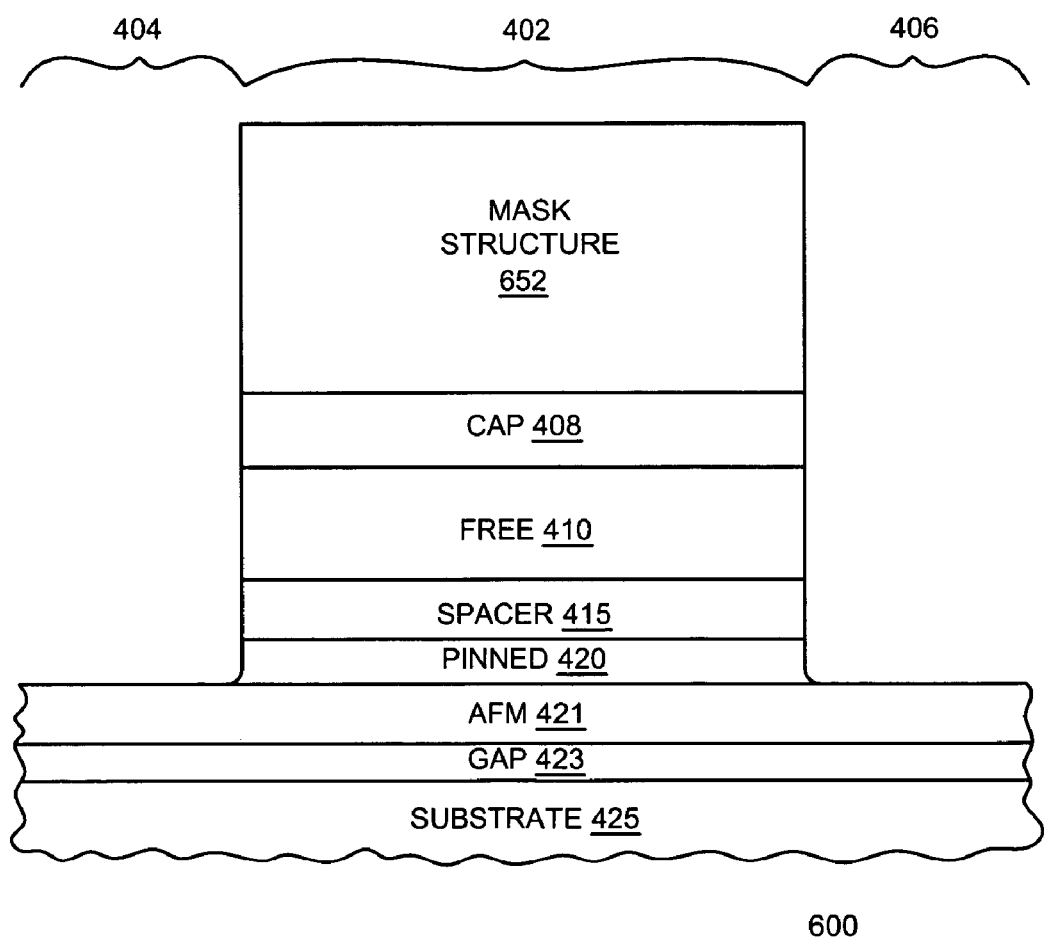
FIG. 6 shows a representative SV sensor stack structure of the present application.

FIGS. 5-8 are illustrations relating to a preferred method of making the read sensor of FIG. 4 according to the present application. Referring first to FIG. 6, however, a partially-constructed multi-layered spin valve (SV) sensor stack structure 600 is shown, which illustrates the structure after the processing steps defining central region 402 of the sensor have been completed. To reach this stage of the processing in FIG. 6, the multi-layered SV sensor structure is deposited as is well established in the art. A mask structure 652 is applied and patterned over multi-layered SV sensor stack structure 600 in a central region 402. Mask structure 652 may, for example, be or include a resist such as a photoresist. However, non-resist materials in mask structure 652 may be utilized.

Mask structure 652 is preferably formed so as to not have any undercuts, but rather straight sidewalls from top to bottom; that is, the mask structure sidewalls are substantially normal to a plane defined by the previously deposited read sensor layers. Although mask structure 652 may be a monolayer mask structure (e.g. a monolayer photoresist), it may alternatively be a multi-layered mask structure (e.g. bilayer or trilayer resist) which is formed without undercuts. Further alternatively, mask structure 652 may be structured so as to have undercuts (e.g. a bilayer resist having undercuts).

In any case, mask structure 652 is formed with a suitable width so as to define an appropriate trackwidth (TW) for the SV sensor. Mask structure 652 masks the active region of the sensor during the ion beam milling and deposition process, for a multi-layered structure to be subsequently deposited in end regions 404 and 406. The layers formed under the mask have been protected during the ion milling process and remain intact. However, the portions of a pinned layer 420, a spacer layer 415, a sensing layer 410, and a capping layer 408 that are not protected by the mask during the ion milling process are removed in end regions 404 and 406 by the ion mill. The ion milling process can be stopped at any one of these layers.

Figure 7:
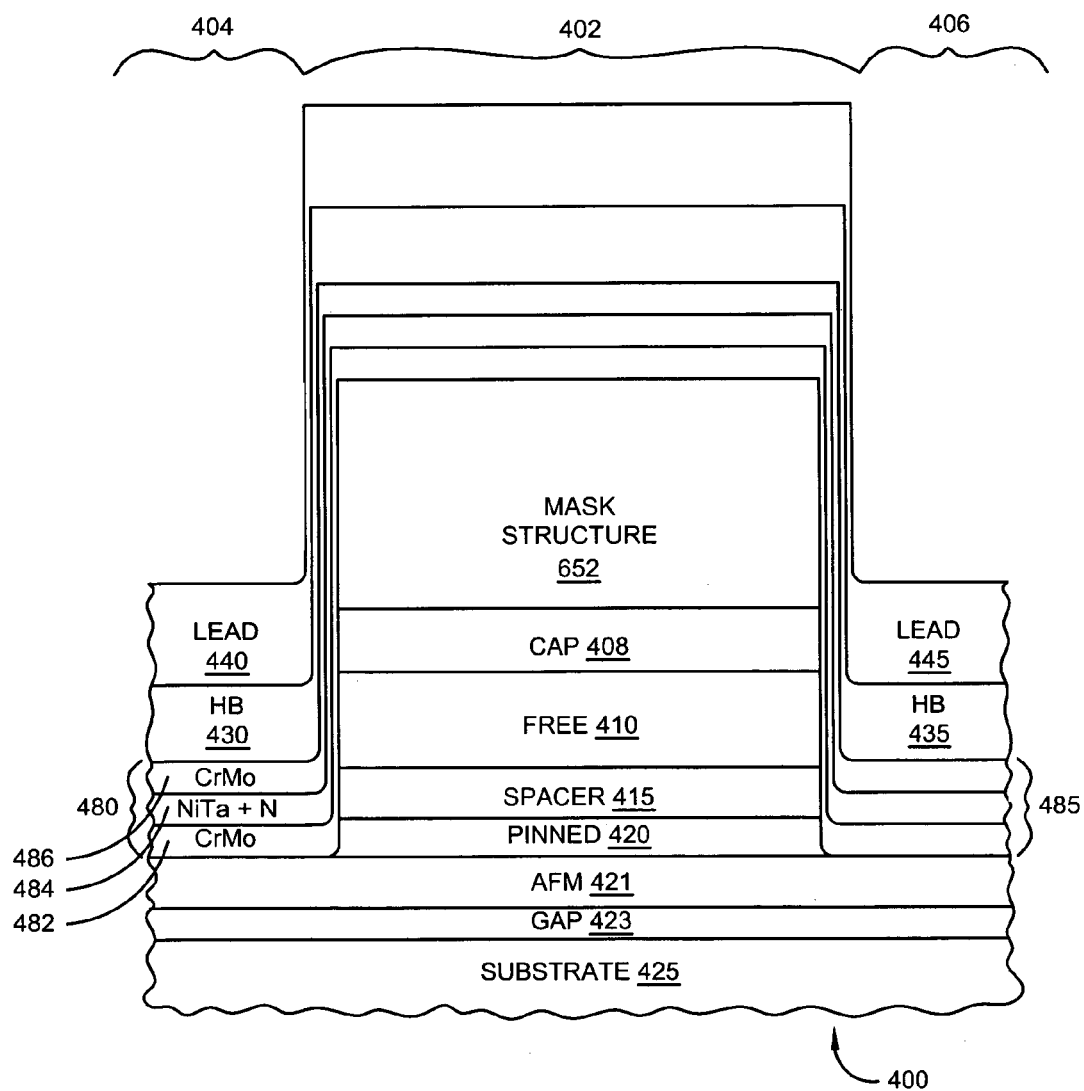
FIG. 7 shows an SV sensor after the processing steps of depositing the multi-layered structure, a hard biasing layer, and a conductor lead structure.

In FIG. 7, an SV sensor after a multi-layered structure 480, hard bias layers, and conductive lead layers have been deposited using ion beam sputtering deposition is shown. Beginning at a start block 502 of the flowchart of FIG. 5, in combination with the view of FIG. 7, a first layer 482 made of CrMo is deposited in the end regions adjacent crystalline materials of sensor stack structure 600 (step 504 of FIG. 5). Preferably, first layer 482 made of the CrMo is deposited to a thickness between 3 to 50 Å, and preferably has a specific thickness of about 10 Å. First layer 482 made of the CrMo is deposited so as to homogenize the type of surface subsequently deposited nickel-tantalum is formed on.

Nickel-tantalum (NiTa) is then deposited in a nitrogen ($N_2$) atmosphere over first layer 482 made of CrMo to form a second layer 484 made of nitrogenated nickel-tantalum (NiTa+N) (step 506 of FIG. 5). Preferably, second layer 484 made of the nitrogenated nickel-tantalum is deposited to a thickness between about 3 to 100 Å, and preferably has a specific thickness of about 15 Å. The deposition of NiTa in the nitrogen atmosphere does not increase the contiguous junction resistance by any significant amount. In this embodiment, the NiTa is deposited in the nitrogen atmosphere with a nitrogen sputtering pressure of about $2.5 \times 10^{-5}$ Torr for a time range of about 15 to 60 seconds, and preferably for about 30 seconds. Advantageously, the deposition process in the nitrogen atmosphere increases the squareness of the hard bias materials.

By depositing the NiTa in the nitrogen atmosphere, the microstructure of the NiTa is changed resulting in an amorphous microstructure. As a result, second layer 484 acts as a buffer layer which disrupts the microstructural continuity between crystalline materials of the sensor stack structure and subsequently deposited hard bias layer 430. This leads to improved squareness of the hard bias material.

Next, a third layer 486 made of CrMo is then deposited over second layer 484 made of the nitrogenated nickel-tantalum (step 508 of FIG. 5). Preferably, third layer 486 is deposited to a thickness between 20 to 200 Å, and preferably has a specific thickness of about 50 Å. Third layer 486 is deposited to act as a seed layer which promotes necessary c-axis in plane orientation for increased coercivity of subsequently deposited hard bias layer 430.

The flowchart ends at a finish block 510 of FIG. 5, but additional conventional processing steps may be performed (such as depositing hard bias layers 430 and 435 over third layer 486 made of the CrMo, lead layers 440 and 445 over hard bias layers 430 and 435, respectively). Preferably, hard bias layer 430 is a layer of suitable hard magnetic material, such as cobalt-platinum-chromium (CoPtCr). However, the hard magnet material may be any suitable cobalt-based alloy. Note that multi-layered structure 485 has the same first, second, and third layers as multi-layered structure 480.

Figure 8:
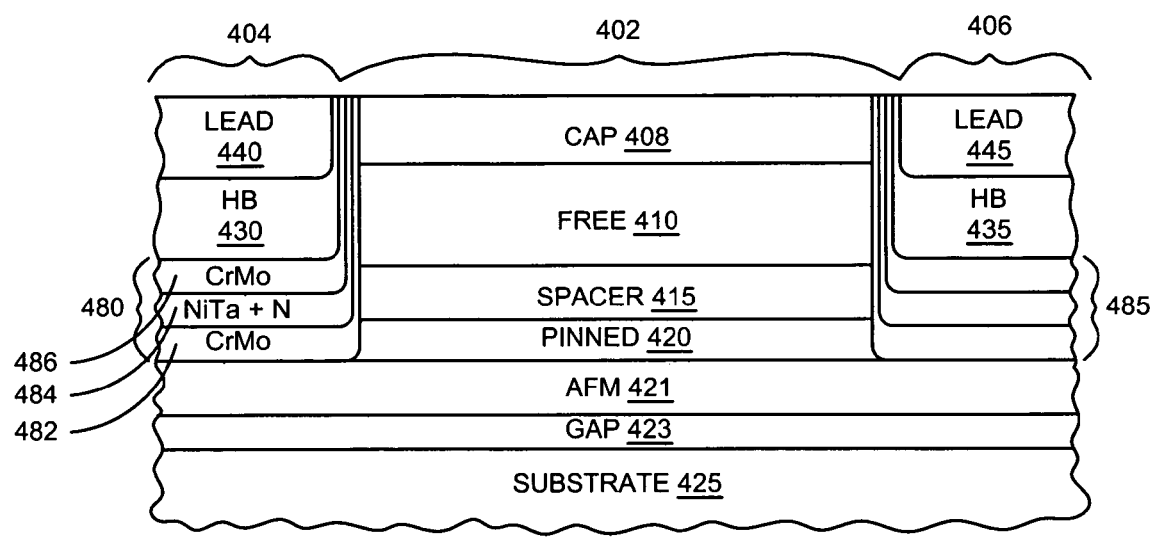
FIG. 8 shows an SV sensor having the multi-layered structure according to the present application.

During the lead deposition process, lead layers 440 and 445 are formed over mask structure 652. In the next process step, a chemical-mechanical polishing (CMP) is performed over the structure to remove mask structure 652 and form a top planar surface. Alternatively, if mask structure 652 is formed with undercuts (e.g. a bilayer mask with undercuts), the mask structure may be removed by utilizing a suitable solvent. The result is the SV sensor structure of FIG. 8. As shown in FIG. 8, the SV sensor has an active SV structure formed in central region 402, and conductive lead layers 440 and 445 and hard bias layers 450 and 455 formed in end regions 404 and 406, respectively. Thin multi-layered seed layer structures 480 and 485 as described are formed below hard bias layers 430 and 435, respectively, in end regions 404 and 406.

Alternatives and additions relating to the present application will now be discussed. As described in relation to step 504 of FIG. 5, in combination with the view of FIG. 7, a first layer 482 of multi-layered structure 480 made of CrMo is deposited in the end regions adjacent crystalline materials of sensor stack structure 600. After this deposition, NiTa is then deposited in a nitrogen atmosphere over first layer 482 made of CrMo to form a second layer 484 made of nitrogenated nickel-tantalum (NiTa+N) of multi-layered structure 480. Alternatively, first layer 484 is not deposited in the end regions adjacent crystalline materials of sensor stack structure 600, rather NiTa is deposited in a nitrogen atmosphere adjacent crystalline materials of sensor stack structure 600 thereby forming a first layer of nitrogenated nickel-tantalum of the multi-layered structure of this alternative embodiment. The method described in relation to the flowchart of FIG. 5 continues as described earlier. According to this embodiment, the first layer of the multi-layered structure is made of nitrogenated nickel-tantalum and the second layer of the multi-layered structure is made of chromium-molybdenum. Preferably, each first layer has a thickness of between 3-100 Angstroms and each second layer has a thickness of between 20-200 Angstroms. Advantageously, the hard bias materials exhibit an increased coercivity and squareness.

As described in relation to step 506 of FIG. 5, in combination with the view of FIG. 7, a layer of NiTa is deposited in a nitrogen atmosphere over first layer 482 made of CrMo to form a second layer 484 made of nitrogenated nickel-tantalum (NiTa+N) of multi-layered structure 480. After this formation, third layer 486 made of CrMo is deposited over second layer 484. Alternatively, prior to the deposition of third layer 486, a top surface of second layer 484 is oxidized, as described in the cross-referenced application, to increase a coercivity and a squareness of the hard bias layer.

Final Comments. Thus, by utilizing a multi-layered seed layer structure made of a layer w comprising chromium (Cr) (e.g. chromium-molybdenum), a layer x comprising nitrogenated nickel-tantalum (NiTa+N), and a layer y comprising chromium (e.g. chromium-molybdenum), formed over crystalline materials of the sensor stack structure, improved hard magnetic properties are exhibited by a hard bias layer. In this embodiment, layer w is a first layer of the multi-layered structure corresponding to a bottom layer of the multi-layered structure; layer x is a second layer of the multi-layered structure corresponding to a middle layer of the multi-layered structure; and layer y is a third layer of the multi-layered structure corresponding to a top layer of the multi-layered structure. As a result, the hard bias layer exhibits increased coercivity and squareness. For example, the hard bias layer may have an increased coercivity of 1400 Oersteds (Oe) or higher. Alternatively, the multi-layered structure may have a layer w comprising nitrogenated nickel-tantalum (NiTa+N) and a layer x comprising chromium (e.g. chromium-molybdenum) formed adjacent crystalline materials of the sensor stack structure. In this embodiment, layer w is a first layer of the multi-layered structure corresponding to a bottom layer of the multi-layered structure and layer x is a second layer of the multi-layered structure corresponding to a top layer of the multi-layered structure.

A magnetic head of the present application with improved hard magnet properties includes a sensor stack structure and a multi-layered seed layer structure formed over crystalline materials of the sensor stack structure. The multi-layered structure has a first layer including chromium-molybdenum (CrMo); a second layer including nitrogenated nickel-tantalum (NiTa+N); and a third layer including chromium-molybdenum (CrMo). A hard bias layer formed over the multi-layered structure is preferably cobalt-platinum-chromium (CoPtCr). The crystalline materials may include materials such as tantalum (Ta), nickel-iron (NiFe), cobalt-iron (CoFe), copper (Cu), ruthenium (Ru), and platinum-manganese (PtMn), as examples. A lead layer may be formed over the hard bias layer.

A hard disk drive of the present application may embody the magnetic head. This hard disk drive has at least one rotatable magnetic disk; a spindle supporting the at least one rotatable magnetic disk; a disk drive motor for rotating the at least one rotatable magnetic disk; a magnetic head for reading data from the at least one rotatable magnetic disk; and a slider for supporting the magnetic head. The magnetic head having improved hard magnet properties includes a SV sensor; a multi-layered seed layer structure formed upon crystalline materials of the sensor in end regions (or in a central region) adjacent the sensor; and a hard bias layer formed over the multi-layered seed layer structure. The multi-layered structure includes a first layer comprising chromium-molybdenum (CrMo), a second layer comprising nitrogenated nickel-tantalum (NiTa+N), and a third layer made of chromium-molybdenum (CrMo). The hard bias layer may be made from a cobalt-based alloy, such as cobalt-platinum-chromium (CoPtCr). The crystalline materials of the sensor includes materials such as tantalum (Ta), nickel-iron (NiFe), cobalt-iron (CoFe), copper (Cu), ruthenium (Ru), platinum-manganese (PtMn), as examples. A lead layer may be formed over the hard bias layer.

Finally, a method for use in forming a magnetic head of the present application includes forming a sensor stack structure and then forming a multi-layered seed layer structure over crystalline materials of the sensor stack structure. The multi-layered structure includes a bottom layer comprising chromium-molybdenum (CrMo), a middle layer comprising nitrogenated nickel-tantalum (NiTa+N), and a top layer comprising chromium-molybdenum (CrMo). The hard bias layer may be made from a cobalt-based alloy, such as cobalt-platinum-chromium (CoPtCr). The crystalline materials of the sensor include materials such as tantalum (Ta), nickel-iron (NiFe), cobalt-iron (CoFe), copper (Cu), ruthenium (Ru), and platinum-manganese (PtMn), as examples. A lead layer may be formed over the hard bias layer.

Advantageously, by utilizing multi-layered seed layer structures made of the present application formed adjacent crystalline materials of the sensor stack structure, the hard bias material exhibits improved properties as compared to prior art seed layer structures formed over crystalline materials.

It is to be understood that the above is merely a description of preferred embodiments of the invention and that various changes, alterations, and variations may be made without departing from the true spirit and scope of the invention as set for in the appended claims. Few if any of the terms or phrases in the specification and claims have been given any special particular meaning different from the plain language meaning to those skilled in the art, and therefore the specification is not to be used to define terms in an unduly narrow sense.

What is claimed is:

1. A magnetic head, comprising:
   a sensor stack structure;
   a multi-layered structure formed over crystalline materials of the sensor stack structure;
   the multi-layered structure comprising:
   a layer comprising nitrogenated nickel-tantalum (NiTa+N); and
   a layer comprising chromium (Cr) formed over the layer comprising NiTa+N.

2. The magnetic head of claim 1, further comprising:
   wherein the layer comprising NiTa+N further comprises a bottom layer of the multi-layered structure; and
   wherein the layer comprising Cr further comprises a top layer of the multi-layered structure.

3. The magnetic head of claim 1, further comprising:
   a bottom layer comprising Cr of the multi-layered structure;
   wherein the layer comprising NiTa+N further comprises a middle layer of the multi-layered structure; and
   wherein the layer comprising Cr further comprises a top layer of the multi-layered structure.

4. The magnetic head of claim 1, wherein the layer comprising nitrogenated NiTa further comprises:
   a layer comprising surface-oxidized NiTa+N.

5. The magnetic head of claim 1, further comprising a hard bias layer formed over the multi-layered structure.

6. The magnetic head of claim 1, wherein the multi-layered structure comprises a seed layer structure.

7. The magnetic head of claim 1, wherein the multi-layered structure is formed in end regions adjacent the sensor stack structure.

8. The magnetic head of claim 1, wherein the layer comprising chromium (Cr) comprises chromium-molybdenum (CrMo).

9. The magnetic head of claim 1, wherein the crystalline materials include at least one of magnetic materials and electrically conductive materials of the sensor stack structure.

10. The magnetic head of claim 1, wherein the crystalline materials comprise one of a pinning layer and a pinned layer of the sensor stack structure.

11. The magnetic head of claim 1, further comprising:
    a hard bias layer formed over the multi-layered structure; and
    wherein the NiTa+N layer increases a coercivity and a squareness of the hard bias layer.

12. The magnetic head of claim 1, further comprising:
    a hard bias layer formed over the multi-layered structure; and
    wherein the hard bias layer is a cobalt-based alloy.

13. The magnetic head of claim 1, further comprising:
    a hard bias layer formed over the multi-layered structure; and
    a lead layer formed over the hard bias layer.

14. A hard disk drive, comprising:
    at least one rotatable magnetic disk;
    a spindle supporting the at least one rotatable magnetic disk;
    a disk drive motor for rotating the at least one rotatable magnetic disk;
    a magnetic head for reading data from the at least one rotatable magnetic disk;
    a slider for supporting the magnetic head;
    the magnetic head, comprising:
    a sensor stack structure;
    a multi-layered structure formed over crystalline materials of the sensor stack structure;
    the multi-layered structure comprising:
    a layer comprising nitrogenated nickel-tantalum (NiTa+N); and
    a layer comprising chromium (Cr) formed over the layer comprising NiTa+N.

15. The hard disk drive of claim 13, further comprising:
    wherein the layer comprising NiTa+N further comprises a bottom layer of the multi-layered structure; and
    wherein the layer comprising Cr further comprises a top layer of the multi-layered structure.

16. The hard disk drive of claim 13, further comprising:
    a bottom layer comprising Cr of the multi-layered structure;
    wherein the layer comprising NiTa+N further comprises a middle layer of the multi-layered structure; and
    wherein the layer comprising Cr further comprises a top layer of the multi-layered structure.

17. The hard disk drive of claim 13, wherein the layer comprising NiTa+N further comprises:
    a layer comprising surface-oxidized NiTa+N.

18. The hard disk drive of claim 13, further comprising a hard bias layer formed over the multi-layered structure.

19. The hard disk drive of claim 13, wherein the multi-layered structure comprises a seed layer structure.

20. The hard disk drive of claim 13, wherein the multi-layered structure is formed in end regions adjacent the sensor stack structure.

21. The hard disk drive of claim 13, wherein the layer comprising Cr comprises chromium-molybdenum (CrMo).

22. The hard disk drive of claim 13, wherein the crystalline materials include at least one of magnetic materials and electrically conductive materials of the sensor stack structure.

23. The hard disk drive of claim 13, wherein the crystalline materials comprise one of a pinning layer and a pinned layer of the sensor stack structure.

24. The hard disk drive of claim 13, further comprising:
    a hard bias layer formed over the multi-layered structure; and
    wherein the layer comprising NiTa+N increases a coercivity and a squareness of the hard bias layer.

25. The hard disk drive of claim 13, further comprising:
    a hard bias layer formed over the multi-layered structure; and
    wherein the hard bias layer is a cobalt-based alloy.

26. The hard disk drive of claim 13, further comprising:
    a hard bias layer formed over the multi-layered structure; and
    a lead layer formed over the hard bias layer.

* * * * *